United States Patent [19]
Kirchhoff

[11] Patent Number: 5,598,124
[45] Date of Patent: Jan. 28, 1997

[54] CIRCUIT CONFIGURATION FOR SUPPRESSING NOISE SIGNALS

[75] Inventor: Hans-Gerd Kirchhoff, Ratingen, Germany

[73] Assignee: Siemens Aktiengesellschaft, Munich, Germany

[21] Appl. No.: 509,412

[22] Filed: Jul. 31, 1995

[30] Foreign Application Priority Data

Jul. 29, 1994 [DE] Germany ............... 44 27 015.1

[51] Int. Cl.$^6$ .................. H03K 17/62; H04B 1/10
[52] U.S. Cl. .................. 327/552; 327/404; 327/434; 327/558
[58] Field of Search .................. 327/552, 558, 327/437, 404

[56] References Cited

U.S. PATENT DOCUMENTS

| | | | |
|---|---|---|---|
| 4,733,203 | 3/1988 | Ayashi | 327/404 |
| 5,113,098 | 5/1992 | Teymouri | 307/520 |
| 5,420,534 | 5/1995 | Elador | 327/404 |

FOREIGN PATENT DOCUMENTS 203445 10/1983 Germany.
2030404 4/1980 United Kingdom.

OTHER PUBLICATIONS

IBM Technical Discl. Bulletin vol. 27, No. 11, Apr. 1985, pp. 6391–6392, "Organelle for Logically . . . ".
TTL–Publ. Texas Instruments Deutschland GmbH, pp. 112–116, Jul. 1978, "RC–filter (low pass filter)".
Radio Fernsehen Elektronik VEB Verlag vol. 32 (1983) No. 4, pp. 207–211, "Verbesserung der Störsicherheit . . . ".

*Primary Examiner*—Margaret Rose Wambach
*Attorney, Agent, or Firm*—Herbert L. Lerner; Laurence A. Greenberg

[57] ABSTRACT

A circuit configuration for noise signal suppression includes an input signal terminal and two inputs being controlled by the input signal terminal. Transfer gates are each connected in series with a respective one of the inputs and have a terminal being connected to the input signal terminal. A transistor is connected as a capacitor in parallel with each of the inputs.

3 Claims, 1 Drawing Sheet

CIRCUIT CONFIGURATION FOR SUPPRESSING NOISE SIGNALS

BACKGROUND OF THE INVENTION

Field of the Invention

The invention relates to a circuit configuration for noise signal suppression, which includes a circuit having two inputs controlled by one input signal terminal.

One such circuit is known from the publication by U. Tietze and C. Schenk, entitled: Halbleiter-Schaltungstechnik [Semiconductor Circuitry], published by Springer-Verlag, 7th Edition, 1985, page 183, in combination with a precision Schmitt trigger.

As is described in greater detail below with regard to FIG. 2, in conventional Schmitt triggers, the switchover levels of the characteristic hysteresis curve do not have the same precision as with typical operational amplifiers. Although the circuit of FIG. 3 represents an improvement, the function of the circuit in the event of problems is not reliably assured.

SUMMARY OF THE INVENTION

It is accordingly an object of the invention to provide a circuit configuration for suppressing noise signals, which overcomes the hereinafore-mentioned disadvantages of the heretofore-known devices of this general type.

With the foregoing and other objects in view there is provided, in accordance with the invention, a circuit configuration for noise signal suppression, comprising a common input signal terminal; two inputs being controlled by the input signal terminal; a transfer gate being connected in series with each of the inputs and having a terminal being connected to the common input signal terminal; and a transistor being connected as a capacitor and being parallel to each of the inputs.

The invention has the advantage of filtering out externally acting problems in the signal direction before they can reach the inputs of the bistable multivibrator, and of causing internal problems to act in common-mode fashion on the inputs of the multivibrator. In the case where the circuit configuration is made by CMOS technology, for instance on an integrated semiconductor chip, spikes occurring when the transistors are made conducting cannot affect the desired function of the circuit, or can only affect it slightly.

In accordance with another feature of the invention, the transistor being connected as a capacitor is a single transistor for both of the inputs.

In accordance with a concomitant feature of the invention, the transfer gates in combination with the transistor connected as a capacitor form a low-pass filter.

Other features which are considered as characteristic for the invention are set forth in the appended claims.

Although the invention is illustrated and described herein as embodied in a circuit configuration for suppressing noise signals, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 2:
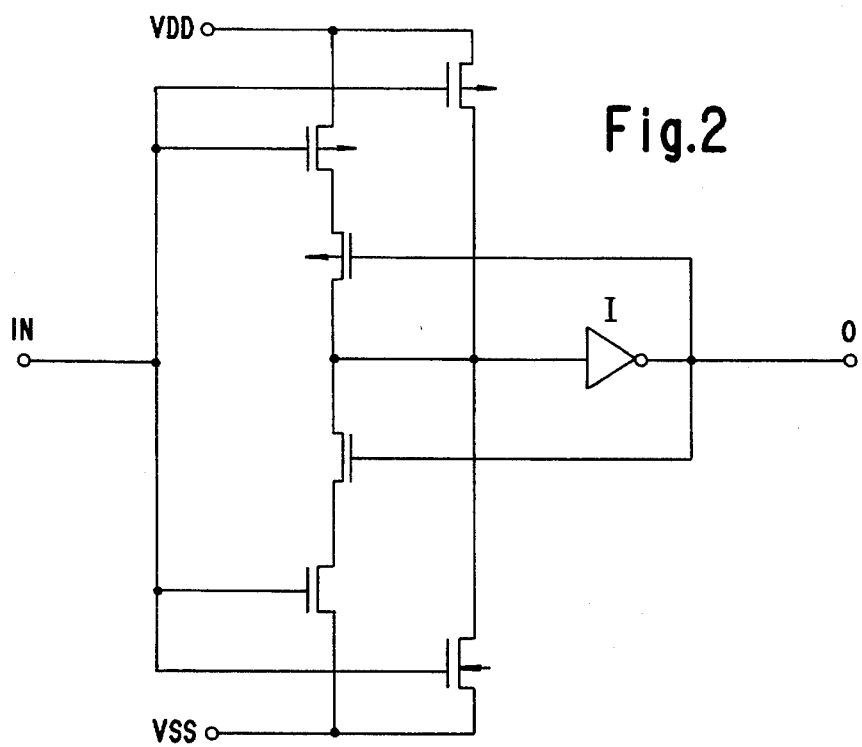
FIGS. 2 and 3 are schematic diagrams of circuit configurations according to the prior art.

Referring now to the figures of the drawing in detail and first, particularly, to FIG. 2 thereof, there is seen a Schmitt trigger in which an input signal IN is supplied through transistors to an Inverter I having an output leading to a terminal O. Two of the transistors are respectively connected to a supply potential VDD and a supply potential VSS. In that typical Schmitt trigger, switchover levels of a characteristic hysteresis curve do not have the same precision as typical operational amplifiers, since an output voltage influences switching thresholds but is not accurately defined.

Figure 3:
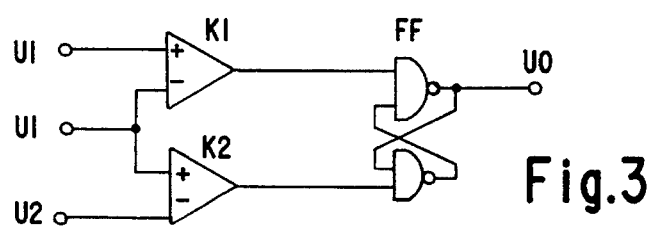

In the aforementioned publication by U. Tietze and C. Schenk, Halbleiter-Schaltungstechnik [Semiconductor Circuitry], Springer-Verlag, 7th Edition, 1985, page 183, that disadvantage is overcome by fixing the switching thresholds using two comparators. The comparators set an RS flip-flop if the upper switching level is exceeded, and they cancel the flip-flop if the lower switching level is not attained. A basic diagram thereof is shown in FIG. 3. In FIG. 3, an input voltage UI is compared with two switching thresholds U1 and U2 of two comparators K1 and K2. Outputs of the comparators respectively control set and reset inputs of a flip-flop FF.

While the configuration of FIG. 3 is improved over the Schmitt trigger of FIG. 2 because the switching thresholds are precisely defined, nevertheless the function of the circuit in the event of problems, such as signals contaminated with noise, or upon fluctuations in the internal supply voltage or in the event of externally coupled-in signals, is not reliably assured. For example, at a predetermined input signal UI and a brief reduction in the positive supply voltage, or a brief rise or increase in the reference potential, the switching thresholds of the comparators can be influenced in such a way that one of the comparators will already be made conducting even though the switching point for unimpeded operation has not yet been reached.

Figure 1:
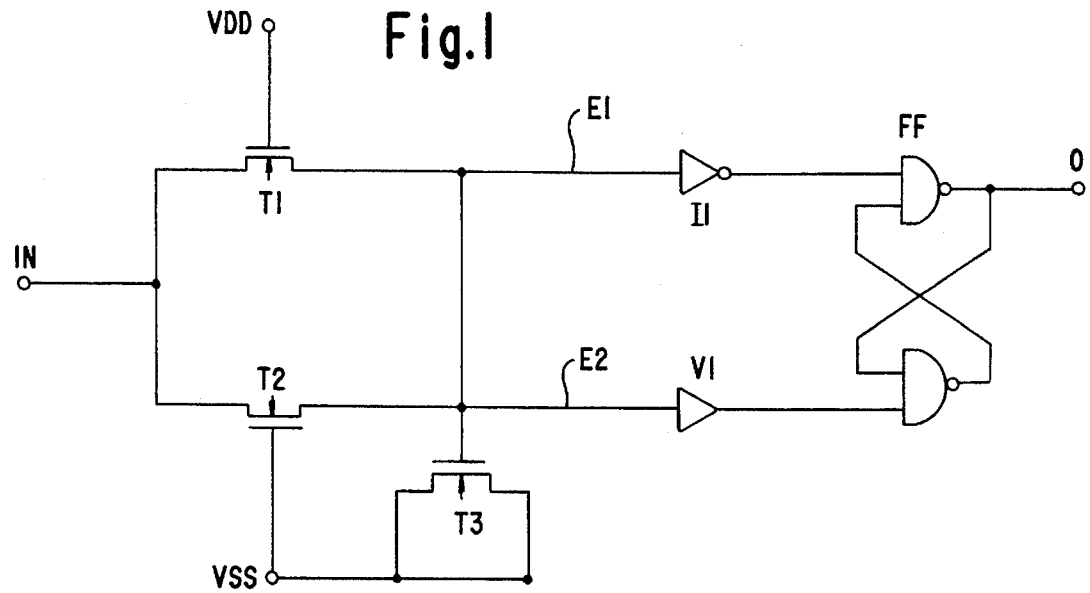
FIG. 1 is a schematic circuit diagram of an exemplary embodiment of the invention.

In FIG. 1, an input signal terminal IN is connected to one terminal of each of two transistors T1 and T2 acting as transfer gates. The transistor T1 is controlled by a positive supply potential VDD and the transistor T2 is controlled by a negative supply potential VSS. Other output terminals of the transistors T1 and T2, which are located in the signal direction, are connected to one another and are also connected to an input E1 of an inverter I1, to an input E2 of an amplifier V2 and to a control input of a transistor T3. Output terminals of the transistor T3 are connected to one another and to the supply potential VSS. Output terminals of the inverter I1 and the amplifier V1 each control one input of a flip-flop FF made of two NAND gates, which are not identified by reference symbols but are coupled crosswise from an output to an input. One output of the flip-flop is provided at a terminal O.

The transistors T1 and T2 that are constructed as transfer gates have high impedance and thus act as a resistor. The transistor T3 is connected as a capacitor. Thus the transistors T1–T3 act as an RC filter to filter out low frequencies. Typically, the limit frequency of this filter member is adjusted to approximately 20 MHz. However, other limit frequencies are also possible, depending on the particular application. On one hand, the output signal of the low-pass filter including the elements T1–T3 reaches the amplifier V1, which can have a switching threshold of 1.3 V, for instance. On the other hand, the input of the inverter I1 has a switching threshold which is higher than that of the amplifier V1 and can typically be approximately 2.8 V. If the switching threshold of the amplifier V1 is exceeded, then the input following this amplifier of the flip-flop is applied to high potential. On the other hand, if the switching threshold of the inverter I1 fails to be attained, then the input of the following NAND gate of the flip-flop is set to low potential. Thus the flip-flop performs a function of the kind already explained in conjunction with FIG. 3.

While external signal problems are filtered out by the low-pass filter made up of the elements T1–T3, internal problems, for instance in the supply voltage potential, act in common-mode fashion upon the inputs of the amplifier and the inverter. By simultaneously varying the switching performance of the amplifier and the inverter on the basis of the internal problem, this problem is thus compensated for, so that the problem has no effect on the function of the circuit.

It is understood that the transfer gates may also be constructed in some other way. The invention is also suitable for such other exemplary embodiments, such as Schmitt triggers, for instance for reset circuits.

I claim:

1. A circuit configuration for noise signal suppression, comprising:

an input signal terminal;

two inputs being controlled by said input signal terminal;

transfer gates each being connected in series with a respective one of said inputs and having first and second terminals, said first terminal being connected to said input signal terminal; and at least one transistor being connected as a capacitor and being connected to said second terminal of each of said transfer gates.

2. The circuit configuration according to claim 1, wherein said at least one transistor being connected as a capacitor is a single transistor for both of said inputs.

3. The circuit configuration according to claim 1, wherein said transfer gates in combination with said at least one transistor connected as a capacitor form a low-pass filter.

* * * * *